(12) United States Patent
Yamada et al.

(10) Patent No.: US 8,916,903 B2
(45) Date of Patent: Dec. 23, 2014

(54) LIGHT EMITTING DEVICE

(71) Applicant: Nichia Corporation, Anan (JP)

(72) Inventors: Motokazu Yamada, Tokushima (JP); Tadaaki Miyata, Yokohama (JP); Naoki Mori, Yokohama (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/936,399

(22) Filed: Jul. 8, 2013

(65) Prior Publication Data
US 2014/0008694 A1    Jan. 9, 2014

(30) Foreign Application Priority Data

Jul. 9, 2012  (JP) .................. 2012-153421

(51) Int. Cl.
| | | |
|---|---|---|
| H01L 33/00 | (2010.01) | |
| H01L 33/48 | (2010.01) | |
| H05K 1/18 | (2006.01) | |
| F21S 4/00 | (2006.01) | |
| H01L 25/075 | (2006.01) | |
| H05K 1/11 | (2006.01) | |
| F21Y 103/00 | (2006.01) | |
| F21Y 101/02 | (2006.01) | |

(52) U.S. Cl.
CPC .............. *H01L 33/483* (2013.01); *F21S 4/005* (2013.01); *H01L 25/0753* (2013.01); *H05K 2201/10106* (2013.01); *H05K 1/111* (2013.01); *F21Y 2103/003* (2013.01); *H05K 1/189* (2013.01); *F21Y 2101/02* (2013.01); *H05K 2201/09363* (2013.01)

USPC ............................................. 257/99; 257/100

(58) Field of Classification Search
USPC ................................................... 257/99, 100
See application file for complete search history.

(56) References Cited

U.S. PATENT DOCUMENTS

2005/0247944 A1    11/2005    Haque et al.

FOREIGN PATENT DOCUMENTS

| | | | |
|---|---|---|---|
| JP | H05-45812 | U | 6/1993 |
| JP | 2000-188001 | A | 7/2000 |
| JP | 2004-103993 | A | 4/2004 |
| JP | 2004-356144 | A | 12/2004 |
| JP | 2005-322937 | A | 11/2005 |
| JP | 2008-515236 | A | 5/2008 |
| JP | 2008-535233 | A | 8/2008 |
| JP | 2011-228463 | A | 11/2011 |
| JP | 2012-146794 | A | 8/2012 |
| WO | 2006-037068 | A2 | 4/2006 |
| WO | 2006-103596 | A2 | 10/2006 |

*Primary Examiner* — Douglas Menz
(74) *Attorney, Agent, or Firm* — Global IP Counselors, LLP

(57) ABSTRACT

A light emitting device that includes a substrate, a light emitting element and a sealing resin member. The substrate includes a flexible base, a plurality of wiring portions and a groove portion between the plurality of wiring portions. The flexible base extends in a first direction corresponding to a longitudinal direction of the substrate and the plurality of wiring portions are arranged on the base. The light emitting element is disposed on the substrate and electrically connected to the plurality of wiring portions. The sealing resin member seals the light emitting element and a part of the substrate. The sealing resin member is spaced apart from a first groove portion of the groove portion, the first groove portion extending in a second direction intersecting the first direction.

26 Claims, 7 Drawing Sheets

LIGHT EMITTING DEVICE

CROSS-REFERENCE TO RELATED APPLICATIONS

This application claims priority to Japanese Patent Application No. 2012-153421, filed on Jul. 9, 2012. The entire disclosure of Japanese Patent Application No. 2012-153421 is hereby incorporated herein by reference.

BACKGROUND OF THE INVENTION

1. Field of the Invention

The present invention relates to a light emitting device.

2. Description of the Related Art

There has been proposed a light emitting device which includes a light emitting element arranged on a flexible substrate, and a sealing member which seals the light emitting element (see, for example, Patent Literature 1: JP2005-322937 A). The light emitting device described in Patent Literature 1: JP2005-322937 A can be rolled up during the production process and transportation, and also can be cut in a desired size for use.

However, in the light emitting device described in JP2005-322937 A, there is a problem in that when the light emitting device is rolled up, concentrations of stress tend to be experienced between the sealing member which seals the light emitting element and the substrate.

SUMMARY OF THE INVENTION

The light emitting device according to the various embodiments includes a substrate, a light emitting device and a sealing resin member. The substrate includes a flexible base, a plurality of wiring portions and a groove portion between the plurality of wiring portions. The flexible base extends in a first direction corresponding to a longitudinal direction of the substrate and the plurality of wiring portions are arranged on the base. The light emitting element is disposed on the substrate and electrically connected to the plurality of wiring portions. The sealing resin member seals the light emitting element and a part of the substrate. The sealing resin member is spaced apart from a first groove portion of the groove portion, the first groove portion extending in a second direction intersecting the first direction

DETAILED DESCRIPTION OF EMBODIMENTS

Figure 1:
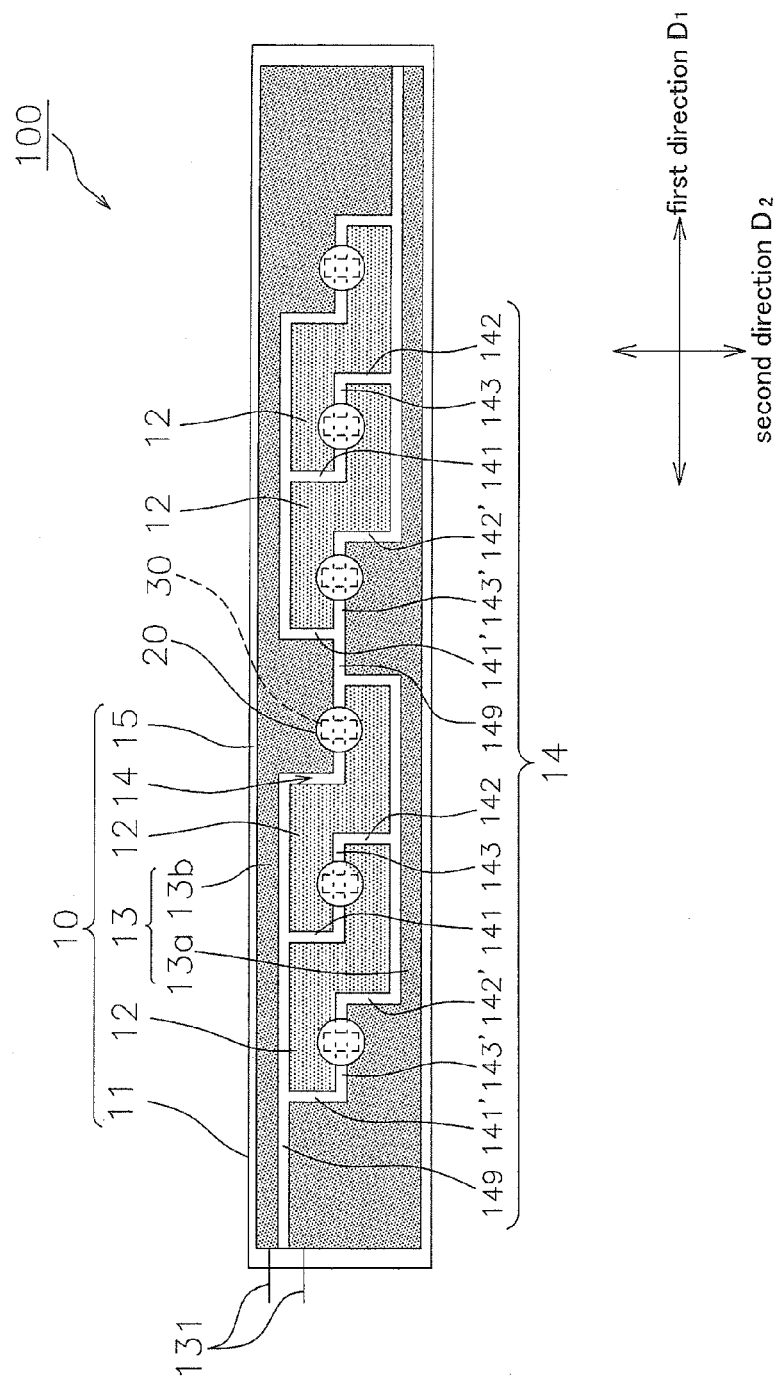
FIG. 1 is a schematic plan view of a light emitting device according to a first embodiment.

Next, embodiments will be described with reference to the drawings. In the description of the drawings below, the same or similar components are denoted by the same or similar reference symbols. However, it should be noted that the drawings are drawn schematically, and the dimensional ratios and the like of the components may differ from the actual ratios. Accordingly, the specific dimension and the like should be determined in consideration of the description below. It should be understood from the drawings and the description herein, that the components of the embodiment shown in the drawings are not limited to the dimensional relationships depicted therebetween, but can be provided with differing relative dimensions that those shown.

The present embodiment is devised in the light of such circumstances, and it is hence an object thereof to provide a light emitting device in which stress experienced between the sealing member which seals the light emitting element and the substrate can be reduced.

1. First Embodiment

Structure of Light Emitting Device 100

Figure 2:
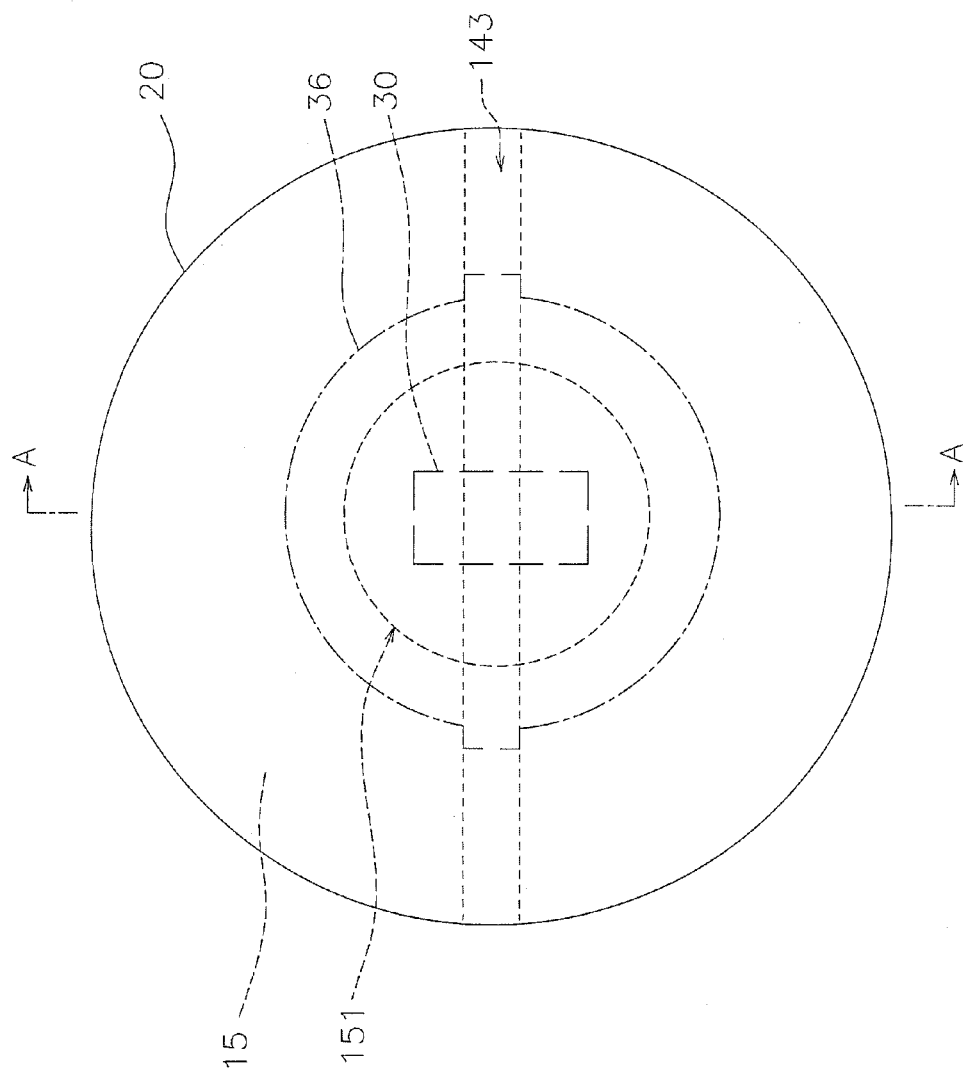
FIG. 2 is an enlarged plan view near a light emitting element shown in FIG. 1.
Figure 3:
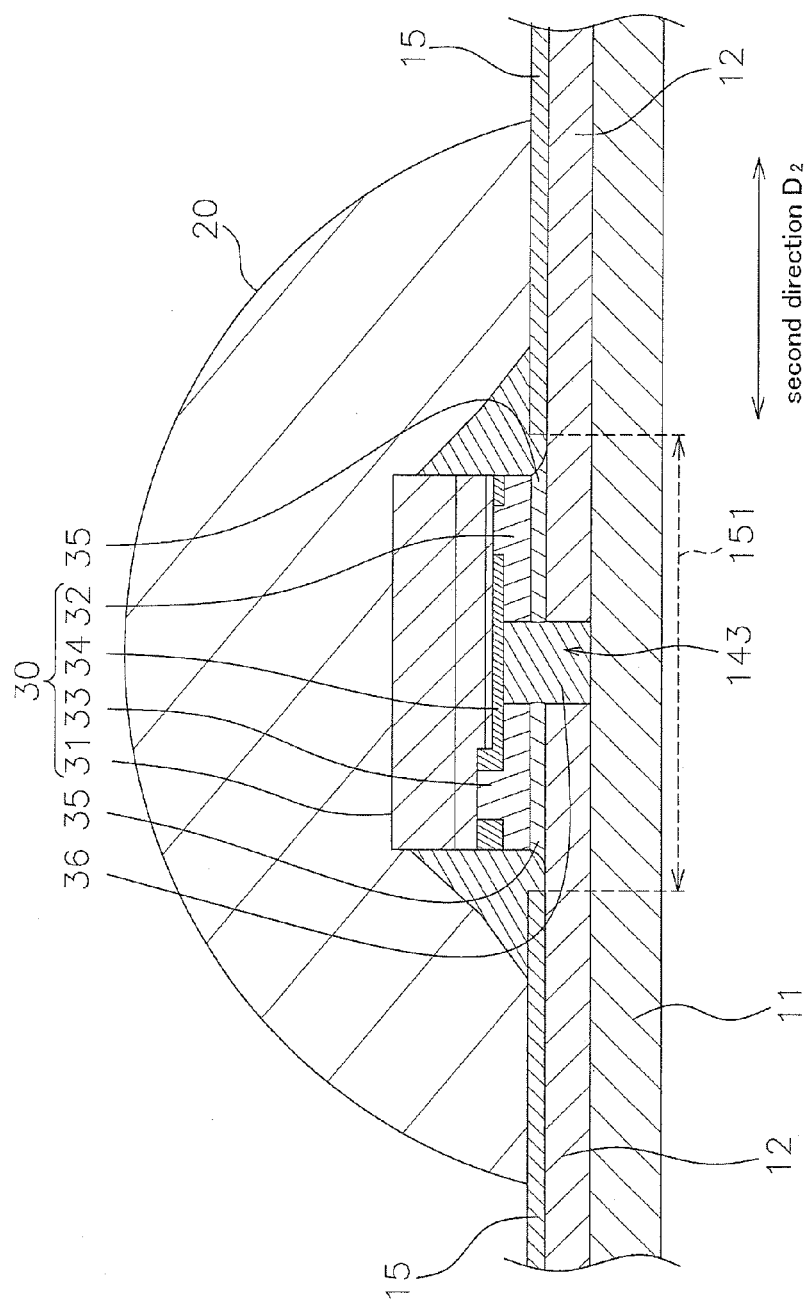
FIG. 3 is a cross sectional view taken along line A-A of FIG. 2.

A structure of a light emitting device 100 according to a first embodiment will be described with reference to the drawings. FIG. 1 is a plan view showing a structure of a light emitting device 100. FIG. 2 is an enlarged plan view near a light emitting element 30 shown in FIG. 1. FIG. 3 is a cross sectional view taken along line A-A of FIG. 2.

The light emitting device 100 includes a substrate 10, a plurality of sealing resin members 20, and a plurality of light emitting elements 30. The light emitting device 100 is flexible, so that it can be stored rolled-up on a reel etc., and can be installed along a curved surface.

The substrate 10 is a flexible elongated member. A first direction $D_1$, shown in FIG. 1, corresponds to the longitudinal direction of the substrate 10 and a second direction $D_2$ is substantially perpendicular to the first direction $D_1$ and corresponds to the lateral direction of the substrate 10. The ratio of the lengths of the substrate 10 in the longitudinal direction and the lateral direction can be appropriately adjusted, for example, to be 6:1, 30:1, or 100:1. The length of the substrate 10 in the longitudinal direction can be 1150 mm, and the length of the substrate 10 in the lateral direction can be 15 mm, for example. The substrate 10 includes a flexible base 11, a plurality of wiring portions 12, a pair of terminal portions 13, a groove portion 14, and a reflective layer 15.

The substrate 10 is made of a flexible insulating material. For such a material, an insulating resin such as polyethylene terephthalate and polyimide can be preferably used but is not limited thereto. For example, the base 11 can be made of a strip of copper foil or aluminum foil which is covered with an insulating resin. The base 11 can have a thickness of about 10 μm to about 100 μm. The material of the base 11 can be appropriately selected in view of the type of mounting of the light emitting elements 30, the reflectance, adhesiveness with other members, etc. For example, in the case where a solder is used for mounting the light emitting elements 30, a polyimide which has a high heat resistance can be preferably used, and in the case where the reflective layer 15, which will be described below, is not disposed on the base 11, a material which has a high optical reflectance (for example a white color material) can be preferably used.

The plurality of wiring portions 12 are arranged on a first main surface of the base 11. Each of the plurality of wiring portions 12 is made of a thin metal film such as a copper foil or an aluminum foil, for example. Each of the plurality of wiring portions 12 can be formed with a crank shape as shown in FIG. 1. The plurality of wiring portions 12 can be arranged in a zigzag manner along the first direction $D_1$. The plurality of wiring portions 12 are also arranged spaced apart from each other. In the present embodiment, the plurality of wiring portions 12 are covered with a reflective layer 15 and are connected to a corresponding light emitting element 30 in a corresponding opening portion 151 to be described below.

The wiring portions 12 have a thickness which does not impair the flexibility of the substrate 10 and a thickness of 8 µm to 150 µm is preferable.

The wiring portions 12 are preferably arranged on the base 11 with the largest possible area. With this arrangement, heat dissipation can be enhanced.

The corners of the wiring portions 12 are preferably rounded. More specifically, the radius of the rounded corners is preferably 100 µm or greater.

A pair of terminal portions 13 can be arranged extending along the first direction $D_1$ on the main surface of the base 11. The pair of terminal portions 13 can be arranged along the second direction $D_2$ at the both sides of each of the plurality of wiring portions 12. As in the present embodiment, with the pair of terminal portions 13 extending along the first direction $D_1$ to the approximately entire sides of the base 11 without being interrupted, the stress which is generated at the time of bending the substrate 10 and is loaded on the light emitting elements 30 and the sealing resin 20 can be reduced. A pair of external wirings 131 are connected to the pair of terminal portions 13, respectively. Electric power is supplied through the pair of external wirings 131 to the pair of terminal portions 13. The pair of external wirings 131 can be connected to corresponding portions of known connectors (not shown) disposed on the base 11.

The pair of terminal portions 13 in addition to the wiring portions 12 can increase the freedom of arrangement of the light emitting elements 30. For example, it is possible that six light emitting elements 30 are arranged three in the first direction $D_1$ and two in the second direction $D_2$ as one block and connected in parallel, then, twelve blocks are arranged in the first direction $D_1$ and connected in series by a pair of terminal portions 13. The pair of terminal portions 13 are at least made up of a positive-side terminal portion 13a and a negative-side terminal portion 13b, and the number of the terminals of each of the pair of terminal portions 13 is not specifically limited. Therefore, each of the pair of terminal portions 13 can be made up of a single terminal or can be made up of a plurality of terminals.

The groove portion 14 is portion on the base 11 where the plurality of wiring portions 12 and the pair of terminal portions 13 are not arranged. That is, the groove portion 14 is arranged between the plurality of wiring portions 12 which are spaced apart from each other, and between the wiring portions 12 and their corresponding terminal portions 13. In other words, the groove portion 14 separates the various wiring portions 12 from one another. Further, as shown in the groove portion 149,141',142',143' for example, the groove portion 14 separate the terminal portions 13 from one another and separate the terminal portions 13 from adjacent ones of the wiring portions 12. Hence, the groove portion 14 is arranged between the pair of terminal portions 13 which are spaced apart from each other. A part of the groove portion 14 can be formed in a crank shape in top view, as shown in FIG. 1. The interval within the groove portion 14 is preferably narrower than the width of the wiring portions 12, and, for example, can be about 0.05 mm to about 5 mm. The configuration of the groove portion 14 will be described later.

The reflective layer 15 covers the base 11, the plurality of wiring portions 12, the pair of terminal portions 13, and the groove portion 14. The reflective layer 15 can cover approximately the entire upper surface of the substrate 10 except for the opening portions 151 which are described below. The reflective layer 15 is made of a material which reflects the emission from the plurality of light emitting elements 30 and the light whose wavelength is converted by a wavelength converting member which will be described later. For such a material, an insulating white ink which is a so-called white resist made of a silicone resin containing titanium oxide is preferably used but is not limited thereto. The reflective layer 15 includes a plurality of opening portions 151, as shown in FIG. 2 and FIG. 3. The opening portions 151 are arranged so that the light emitting elements 30 are connected to the two wiring portions 12 or to a wiring portion 12 and a terminal portion 13, respectively.

The plurality of sealing resin members 20 are arranged on the substrate 10 to cover the opening portions 151 of the reflective layer 15. In the present embodiment, the plurality of sealing resin members 20 are arranged in a row along the first direction $D_1$. Each of the sealing resin members 20 seals one light emitting element 30. In the present embodiment, the sealing resin members 20 respectively have a hemisphere shape with the light emitting element 30 at the center, but the shape is not limited thereto. Such sealing resin members 20 are made of a light-transmissive resin (an epoxy resin, a urea resin, a silicone resin, etc). The sealing resin members 20 can contain a light diffusing agent (barium sulfate, titanium oxide, aluminum oxide, silicon oxide, etc). Also, the sealing resin members 20 preferably contain a wavelength converting member such as a fluorescent material which absorbs light from the light emitting element 30 and release light with a different wavelength than that of the absorbed light. Examples of such a wavelength converting member include an oxide-based fluorescent material, a sulfide-based fluorescent material, and a nitride-based fluorescent material. For example, a gallium nitride based light emitting element to emit blue light is used as the light emitting element and fluorescent materials to absorb blue light, such as a YAG-based fluorescent material or a LAG-based fluorescent material to emit yellow to green light, a SiAlON-based fluorescent material to emit green light, and a SCASN-based fluorescent material and a CASN-based fluorescent material to emit red light, are preferably used singly or in combination. Particularly, for the light emitting devices used for the display devices such as backlights of liquid crystal displays and TV-screens, a SiAlON fluorescent material and a SCASN fluorescent material are preferably used in combination. Also, for lighting applications, a YAG-based fluorescent material or a LAG-based fluorescent material and a SCASN-based fluorescent material or a CASN-based fluorescent material are preferably used in combination.

On the substrate 10, the plurality of light emitting elements 30 are arranged respectively in the opening portions 151 of the reflective layer 15. That is, the plurality of light emitting elements 30 are respectively arranged spaced apart from the first groove portions which extend in the second direction $D_2$ which intersects the first direction $D_1$. With this arrangement, detachment of the plurality of light emitting elements 30 from the substrate 10 can be prevented. In the present embodiment, the plurality of light emitting elements 30 are arranged in a row along the first direction $D_1$. The two light emitting elements 30 arranged at the center of the row are respectively connected to the wiring portion 12 and the terminal portion 13. Other light emitting elements 30 are respectively connected to two wiring portions 12. In the present embodiment, the light emitting elements 30 are mounted on the substrate 10 in a flip-chip manner so that the longitudinal direction of each light emitting element 30 is substantially in parallel to the second direction $D_2$. In detail, the light emitting elements 30 respectively include a semiconductor structure 31, a p-side electrode 32, an n-side electrode 33, and an insulating layer 24, as shown in FIG. 3. The semiconductor structure 31 includes an n-type layer, an active layer, and a p-type layer respectively made of a gallium nitride-based semiconductor and stacked in the order on a light-transmissive sapphire substrate. The n-side electrode 33 is disposed extending to a lower portion of the p-type layer via the insulating layer 34. The p-side electrode 32 and the n-side electrode 33 are respectively connected to a pair of wiring portions 12 via a pair of bonding members 35. For the bonding member, a solder such as a Sn—Ag—Cu based solder and an Au—Sn based solder, or a metal bump such as Au is preferably used. An underfill material 36 is applied between the light emitting element 30 and the substrate 10. The underfill material 36 can be made of a silicone resin or an epoxy resin, for example. The underfill material 36 preferably has a light reflecting property and more specifically contains titanium oxide or silicon oxide which has a white color. Such an underfill material 36 is preferably disposed on the groove portion 14, on the plurality of wiring portions 12, and further on the reflective layer 15, as shown in FIG. 2 and FIG. 3. With this arrangement, the light extracting efficiency can be enhanced and also the portions where the light emitting elements 30 are disposed can be reinforced efficiently.

Mounting of the light emitting elements 30 is not limited to a flip-chip mounting and a die-bonding or a wire bonding can be employed for bonding.

Configuration of Groove Portion 14

Figure 4:
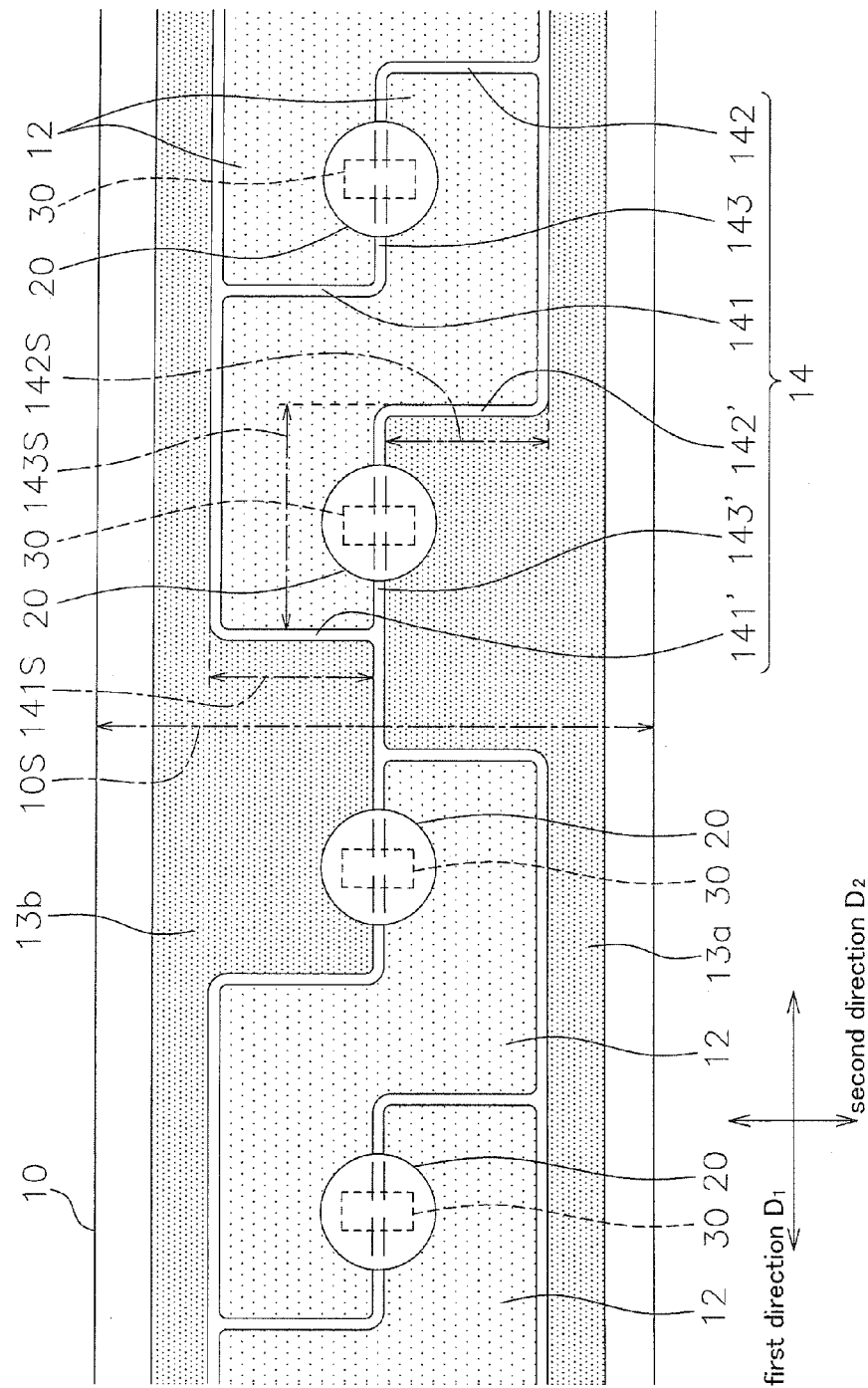
FIG. 4 is an enlarged view of FIG. 1.

Next, the configuration of the groove portion 14 will be described with reference to the drawings. FIG. 4 shows a partially enlarged view of FIG. 1.

The groove portion 14 includes at least one first groove portion 141, at least one second groove portion 142, and at least one third groove portion 143.

The first groove portion 141 extends in a direction which perpendicularly intersects the first direction $D_1$ which is the longitudinal direction of the substrate. In the present embodiment, the first groove portion 141 extends in the second direction $D_2$ which is a lateral direction of the substrate. The length 141S of the first groove portion 141 is about a fourth of the width 10S of the substrate 10 in the second direction $D_2$.

The second groove portion 142 extends along the direction intersecting with the first direction $D_1$ which is the longitudinal direction. In the present embodiment, in a similar manner as in the first groove portion 141, the second groove portion 142 extends in the second direction $D_2$ which is a lateral direction of the substrate. Thus, the first groove portion 141 and the second groove portion 142 are formed approximately in parallel with each other. Also, the first groove portions 141 and the second groove portions 142 are arranged at different locations in the first direction $D_1$. That is, the first groove portions 141 and the second groove portions 142 are not formed along a single straight line in the second direction $D_2$. Also, the first groove portions 141 and the second groove portions 142 are formed at different locations in the second direction $D_2$. The length 142S of the second groove portions 142 is, in a similar manner as in the first groove portions 141, about a fourth of the width 10S of the substrate 10 in the second direction $D_2$.

A third groove portion 143 is continuous with at least one first groove portion 141 and at least one second groove portion 142. The third groove portion 143 extends along a direction which intersects the first groove portion 141 and the second groove portion 142. In the present embodiment, the third groove portions 143 extend along the first direction $D_1$ which is the longitudinal direction of the substrate. Thus, the third groove portions 143 are substantially perpendicularly intersect the first groove portions 141 and the second groove portions 142 respectively. The length 143S of the third groove portions 143 is greater than the length 141S of the first groove portions 141 and the length 142S of the second groove portions 142, but is not limited thereto. At least one light emitting element 30 can be disposed over the third groove portion 143. A sealing resin member 20 which seals the light emitting element 30 is arranged over each of the third groove portions 143.

The first groove portions 141 and the third groove portions 143 are respectively connected to each other with a curve and the second groove portions 142 and the third groove portions 143 are respectively connected to each other with a curve. This arrangement allows smooth connection between the first groove portions 141 and the third groove portions 143 and between the second grooves 142 and the third grooves 143. As described above, a plurality of groove portions are smoothly connected with a curve, which enables to prevent or reduce the stress concentration in the regions where the plurality of groove portions are connected one another. Accordingly, damage on the groove portion 14 and the wiring portions 12 due to bending of the substrate 10 can be prevented.

In the present embodiment, the first groove portions 141 are spaced apart from each of the corresponding sealing resin member 20 and light emitting element 30. In a similar manner, the second groove portions 142 are spaced apart from each of the corresponding sealing resin member 20 and light emitting element 30. That is, in the first direction $D_1$, the sealing resin member 20 and the light emitting element 30 are located between one of the first groove portions 141 and the corresponding second groove portion 142. Thus, the locations of the first groove portions 141 in the first direction $D_1$ are different from the locations of the sealing resin members 20 and the light emitting elements 30 in the first direction $D_1$. In a similar manner, the locations of the second groove portions 142 in the first direction are $D_1$ different from the locations of the sealing resin members 20 and the light emitting elements 30 in the first direction $D_1$. More specifically, in the first direction $D_1$, the second groove portions 142 and the sealing resin members 20 are preferably spaced from each other at a distance of 0.5 mm or more.

The locations of the first groove portions 141 in the second direction $D_2$ differ from the locations of the second groove portions 142 in the second direction $D_2$, however, the substrate 10 tends to bend at the first groove portions 141 and the second groove portions 142. On the other hand, the substrate 10 has a longer side in the longitudinal direction, so that the substrate 10 is not likely bend at the third groove portions 143 which are formed along the longitudinal direction.

The light emitting device 100 as described above employs the flexible substrate 10, so that a roll-to-roll processing method can be used for manufacturing.

Performance and Effect

In the light emitting device 100 according to a first embodiment, the sealing resin 20 is disposed spaced apart from a plurality of first groove portions 141 of the groove portion 14 and extend in a second direction $D_2$ which intersects the first direction $D_1$.

As described above, the sealing resin members 20 are respectively spaced apart from the first groove portions 141. Thus, in the case where the substrate 10 is bent along the first groove portions 141, the bending force of the substrate 10 loaded on the connecting portions with the sealing resin members 20 can be reduced. In other words, arranging the substrate 10 so as to be easily bent along the first groove portions 141 which are respectively spaced apart from the corresponding sealing resin members 20 allows reduction of a stress loaded on the connecting portions between the substrate 10 and the sealing resin members 20. Thus, detachment of the sealing resin members 20 from the substrate 10 can be prevented.

The locations of the second groove portions 142 in the first direction are different from the locations of the sealing resin members 20 and the light emitting elements 30 in the first direction $D_1$.

Thus, the bending force of the substrate 10 can be further prevented from loading on the connecting portions with the sealing resin members 20.

The sealing resin members 20 are arranged over the third groove portions 143 respectively.

Thus, the sealing resin members 20 are respectively spaced apart from the first groove portions 141 and the second groove portions 142, so that the bending force of the substrate 10 loaded on the connecting portions with the sealing resin members 20 can be reduced.

2. Second Embodiment

Next, a structure of a light emitting device 100A according to a second embodiment will be described with reference to the drawings. The difference of the second embodiment from the first embodiment is that five light emitting elements 30 are connected to a pair of wiring portions 12. Now, this difference will be mainly described below.

Figure 5:
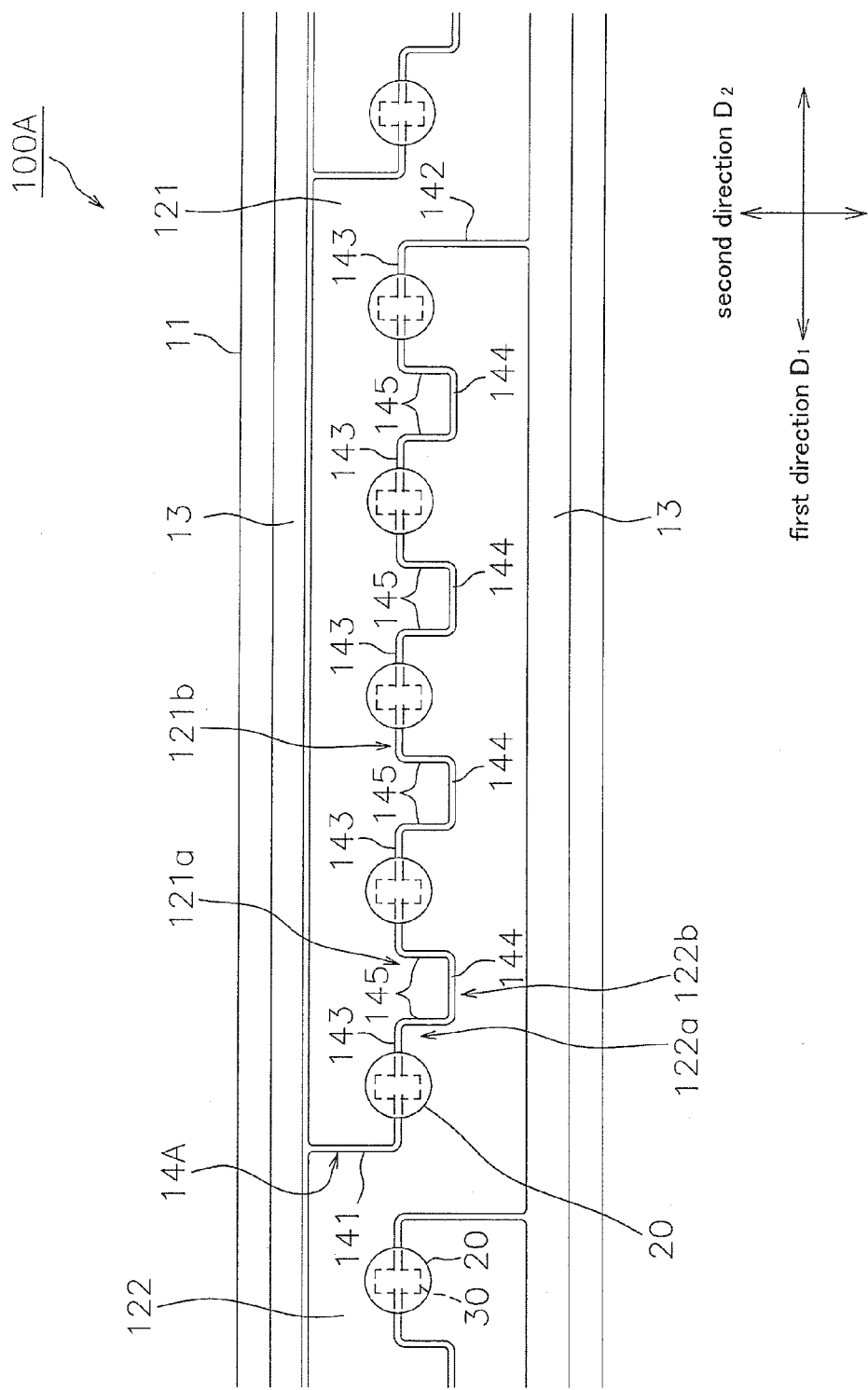
FIG. 5 is a schematic plan view of a light emitting device according to a second embodiment.

FIG. 5 is a partially enlarged plan view showing a configuration of a light emitting device 100A. As shown in FIG. 5, the light emitting device 100A can have a configuration in which a plurality of basic patterns are connected in a longitudinal direction of the light emitting device 100A, in which each basic pattern can include a first and second wiring portions 121, 122, a groove portion 14A, five sealing resin members 20, and five light emitting elements 30.

The first and second wiring portions 121, 122 are adjacent to each other via the groove portion 14A. In a plan view, the first wiring portion 121 can include four first protruded portions 121a and five recessed portions 121b. The four first protruded portions 121 a are protruded toward the second wiring portion 122 side. The five first recessed portions 121b are respectively formed the both sides of each of the four first protruded portions 121a.

Also, in a plan view, the second wiring portion 122 can include five second protruded portions 122a and four second recessed portions 122b. The five second protruded portions 122a are protruded toward the first wiring portion 121 side. The four second recessed portions 122b are respectively formed the both sides of each of the five second protruded portions 122a. The four first protruded portions 121a are respectively protruded into the four second recessed portion 122b in an alternate manner and the five second protruded portions 122a are respectively protruded into the five second protruded portions 121b in an alternate manner.

The groove portion 14A can include a first groove portion 141, a second groove portion 142, five third groove portions 143, four fourth groove portions 144, and eight fifth groove portions 145.

The configuration of the first to the third grove portions 141 to 143 is similar to that in the first embodiment.

The four fourth groove portions 144 are arranged at locations different from that of the five third groove portions 143 in the second direction $D_2$. The four fourth groove portions 144 are arranged respectively between the five third groove portions 143 in the first direction $D_1$. In the present embodiment, the four fourth groove portions 144 respectively extend along the first direction $D_1$ to be approximately in parallel to the five third groove portions 143.

The eight five groove portions 145 are respectively connected to the third groove portion 143 and the fourth groove portion 144. That is, the third grove portions 143 and the fourth groove portions 144 are connected via the fifth groove portions 145 respectively. In the present embodiment, the fifth groove portions 145 extend along the second direction $D_2$ and approximately in parallel to the first groove portions 141 and the second groove portions 142 respectively.

In the light emitting device 100A as described above, the sealing resin members 20 are also spaced apart from the first groove portions 141 and the second groove portions 142 of each groove portion 14A. Thus, detachment of the sealing resin members 20 from the substrate 10 can be prevented.

3. Third Embodiment

Next, a structure of a light emitting device 100B according to a third embodiment will be described with reference to the drawings. The third embodiment differs from the first embodiment in that the shape of the groove portion 14 is different, three or more terminal portions 13 are provided, and two sealing resin members 20 each seals at least one light emitting element 30 are spaced out on each hypothetical line in the second direction $D_2$. Now, mainly the differences will be described below.

Figure 6:
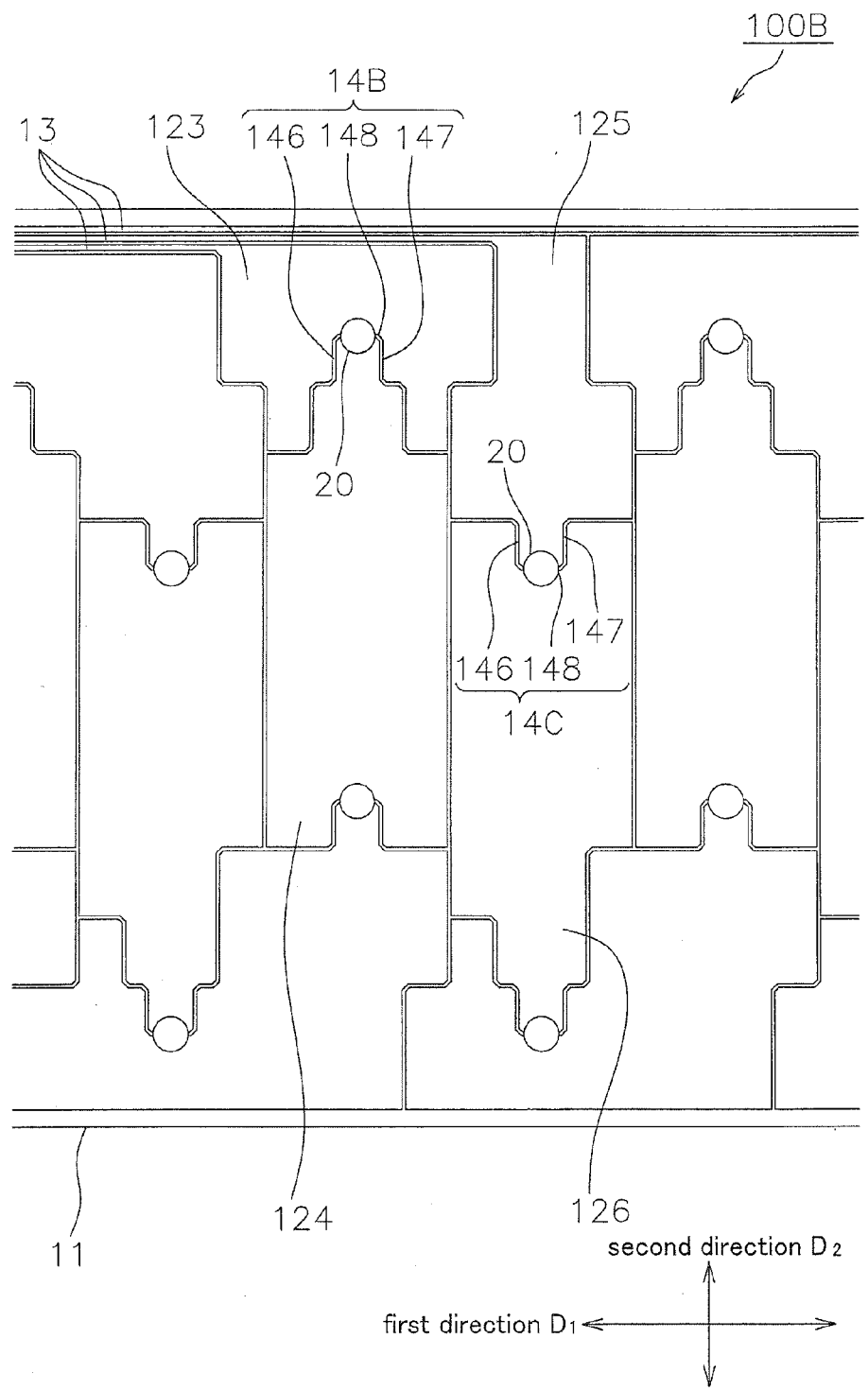
FIG. 6 is a schematic plan view of a light emitting device according to a third embodiment.

FIG. 6 is a partially enlarged plan view showing a configuration of a light emitting device 100B. As shown in FIG. 6, the light emitting device 100B can include a plurality of unit patterns, each of which includes: a third to a sixth wiring portions 123 to 126, a groove portion 14B, and a groove portion 14C. In FIG. 6, a part of the light emitting device 100B is shown enlarged, and in the light emitting device 100B, the pattern shown in FIG. 6 is arranged repeatedly in the longitudinal direction.

Each groove portion 14B is formed between the third wiring portion 123 and the fourth wiring portion 124. Each groove portion 14C is formed between the fifth wiring portion 125 and the sixth wiring portion 126. Each of the groove portions 14B and the groove portions 14C can include a sixth groove portion 146, a seventh groove portion 147, and a eighth groove portion 148.

The sixth groove portions 146 respectively extend along a direction which intersects the first direction $D_1$. In the present embodiment, each sixth groove portion 146 extends along the second direction $D_2$ which is a lateral direction of the substrate.

The seventh groove portions 147 extend along a direction which perpendicularly intersects the first direction $D_1$. In the present embodiment, each seventh groove portion 147extends along the second direction $D_2$ which is a lateral direction of the substrate. Also, the sixth groove portions 146 and the seventh groove portions 147 are arranged at different locations in the first direction $D_1$. Meanwhile, the sixth groove portions 146 and the seventh groove portions 147 which are adjacent each other are arranged on the same locations in the second direction $D_2$.

The eights groove portions 148 are continuous with the sixth groove portions 146 and the seventh groove portions 147 respectively. The eighth grooves 148 extend along a direction which intersects the sixth groove portions 146 and the seventh groove portions 147. In the present embodiment, the eighth groove portions 148 extend along the first direction $D_1$ which is the longitudinal direction of the substrate. The eighth groove portions 148 are substantially perpendicularly intersect the sixth groove portions 146 and the seventh groove portions 147. The light emitting elements 30 re disposed over the eighth groove portions 148 respectively. The sealing resin members 20 which seal the light emitting elements 30 are disposed over the eighth groove portions 148 respectively.

In the light emitting device 100B as described above, the sealing resin members 20 are also spaced apart from the sixth groove portions 146 and the seventh groove portions 147 of each of the groove portions 14B and 14B. Thus, detachment of the sealing resin members 20 from the substrate 10 can be prevented.

Other Embodiments

The present embodiment is described with reference to the embodiments illustrated in the accompanying drawings. It should be understood, however, that the description and the drawings are intended as illustrative of the present embodiment, and the scope of the present embodiment is not limited to those described above. Various alternate embodiments, examples, and operational technologies will become apparent to one skilled in the art, from the description provided herein.

In the embodiments described above, the sealing resin members 20 and the light emitting elements 30 are arranged on a main surface which is at a side of the substrate 10, but the arrangement is not limited thereto. The sealing resin members 20 and the light emitting elements 30 can also be arranged on the main surface and the opposite surface of the substrate 10.

In the above embodiments, each of the light emitting elements 30 is connected to two wiring portions 12, but is not limited thereto. Each of the light emitting elements 30 can be connected to three wiring portions 12. Also, each of the sealing resin members 20 is arranged on the two wiring portions 12, but can be arranged on three wiring portions 12.

In the above embodiments, all the wiring portions 12 are provided with at least one sealing member 20 and at least one light emitting element 30, but are not limited thereto. The light emitting element 30 or/and the sealing member 20 can be not disposed on some of the wiring portions 12.

In the above embodiments, the substrate 10 includes three or more wiring portions 12, but at least two wiring portions 12 are sufficient to be provided. Thus, the light emitting device 100 includes at least one sealing resin member 20 and one light emitting element 30.

In the above embodiments, a pair of (two) wiring portions 12 are connected to one light emitting element 30, but a pair of wiring portions 12 can be connected to a plurality of light emitting elements 30. Also, at least one light emitting element 30 can be connected to a pair of terminal portions 13.

In the above embodiments, one sealing member 20 seals one light emitting element 30, but one sealing member 20 can seal a plurality of light emitting element 30.

In the above embodiments, in a plan view, the shape of the wiring portion 12 is respectively illustrated in FIG. 2, and FIG. 4 through FIG. 6, but the shape of the wiring portion 12 is not limited thereto. The shape of the wiring portion 12 in a plan view can be changed appropriately according to the size of the substrate 10 and to the number of the light emitting element 30 to be used.

In the above embodiments, the groove portion 14 includes groove portions which extend in the second direction $D_2$ (for example, the first and second groove portions 141, 142), but is not limited thereto. The groove portion 14 includes at least a groove portion which extends in a direction intersects the first direction $D_1$.

In the above embodiments, the groove portion 14 is made up of a plurality of straight groove portions, but is not limited thereto. At least one of the plurality of groove portions can be formed with a curved shape, a wavy shape, or the like.

Although not shown in the above embodiments, in addition to the members described above, an associated member such as a Zener diode can be disposed on the substrate 10 or on the wiring portions 12. Stress loaded between the associated members and the substrate 10 can be reduced by arranging the locations of the associated members with respect to the wiring portions 12 and the groove portion 14 in a similar manner as in the light emitting elements 30.

In the above first embodiment, the substrate 10 includes a pair of terminal portions 13, but is not limited thereto. For example, the substrate 10 includes twelve blocks of the light emitting elements 30 and twelve pairs of terminals 13, in which, six light emitting elements 30 are arranged three in the first direction $D_1$ and two in the second direction $D_2$ and are electrically connected as one block, then, twelve blocks are lined in the first direction $D_1$, and twelve pairs of terminals 13 are respectively connected to the respective portions of the twelve blocks. Such a connection allows dimming operation to be performed in the case where the light emitting device 100 is used for the backlight of a TV-display, for example.

Although not shown in the above embodiments, at portions formed in a T-shape among the groove portion 14, the base 11 can be greatly bent along the corresponding groove portions, which can result in a damage of the substrate 10 by the corners of a plurality of plurality of wiring portions. Thus, allowing the base 11 to bend in a multiple directions will be advantageous.

Figure 7:
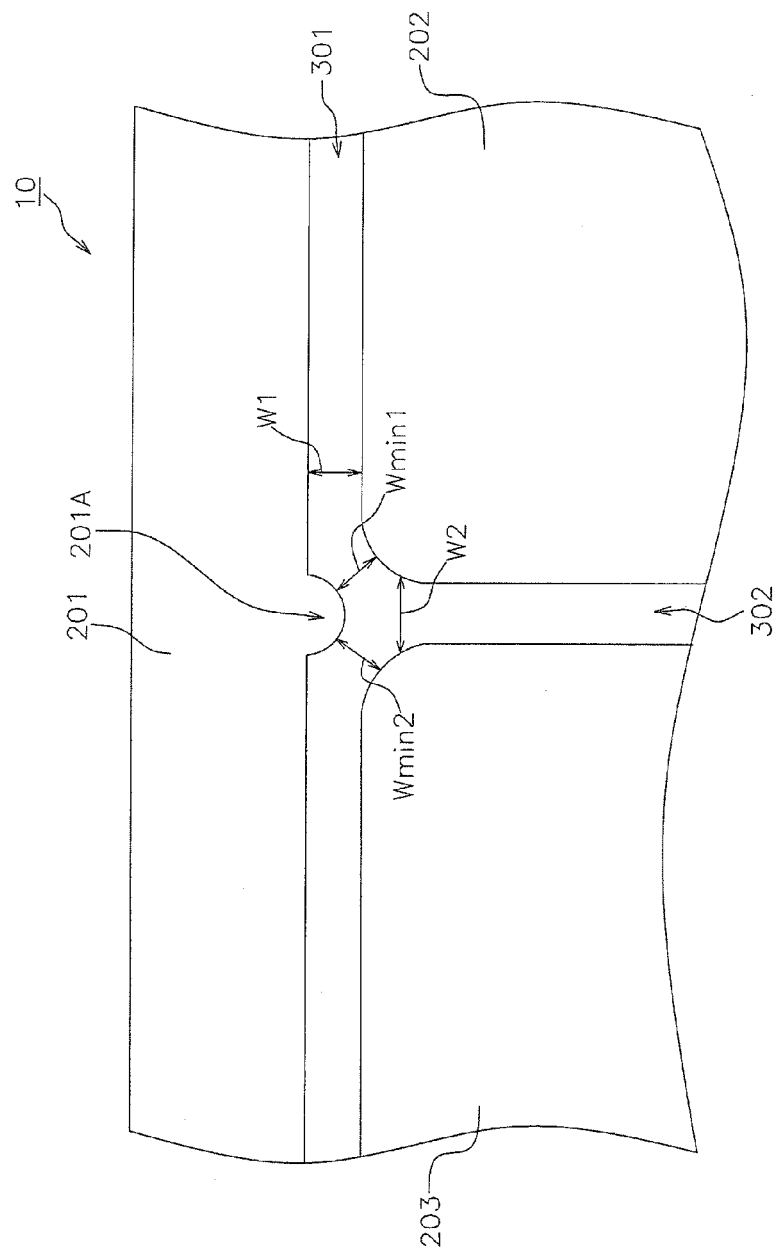
FIG. 7 is an enlarged plan view of a groove portion.

For example, as shown in FIG. 7 which shows an enlarged view of the groove portion 14, the substrate 10 can include the first to third wiring portions 201 to 203, and at least one first straight groove portion 301 and at least one second straight groove portion 302. The first wiring portion 201 is adjacent to the second and the third wiring portions 202, 203, respectively. The second and the third wiring portions 202, 203 are adjacent to each other. The first straight groove portion 301 is arranged in a straight line between the first wiring portion 201 and the second and the third wiring portions 202, 203 respectively. The second straight groove portion 302 is arranged in a straight line between the second wiring portion 202 and the third wiring portion 203. Also, the second straight groove portion 302 is arranged substantially perpendicular to the first straight groove portion 301. Thus, the first straight groove portions 301 and the second straight groove portions 302 intersect each other in a T-shape.

In a plan view, the first wiring portion 201 further includes a projection 201A protruding in the first straight groove portion 301 toward the second straight groove portion 302. In the example shown in FIG. 7, the planar shape of the protruded portion 201A is approximately semicircular, but other appropriate shapes such as triangular or trapezoidal shape can also be employed. As described above, at the region where the first straight groove portion 301 and the second straight groove 302 intersect, the groove becomes a Y-shape by the projection 201A. With this arrangement, the base 11 can be prevented from bending sharply along the first straight groove portion 301 or the second straight groove portion 302.

Also, as shown in FIG. 7, the smallest distance Wmin1 between the projection 201A and the second wiring portion 202 and the width W1 of the first straight groove portion 301 are approximately the same. The smallest distance Wmin2 between the projection 201A and the third wiring portion 203 and the width W1 of the first straight groove portion 301 are approximately the same. The smallest distance Wmin1 and the smallest distance Wmin2 are approximately the same. As described above, the projection 201A allows the width of the grooves between the first to third wiring portions 201 to 203 to be approximately the same or to reduce the difference of the width thereof, which can prevent the base 11 from bending sharply.

Also, it is preferable that the width W1 of the second straight groove portion 302 is wider toward the projection 201A. Thus, the walls of the both sides of the second straight groove portion 302 are formed with curved surfaces so that the second straight groove portion 302 can be smoothly connected to the first straight groove portion 301.

In the configurations described above, the groove portions are arranged between a plurality of wiring portions respectively, but the groove portions can be formed between one of the pair of terminal portions and one or more wiring portions.

As described above, it should be obvious that various other embodiments are possible without departing the spirit and scope of the present embodiments. Accordingly, the scope and spirit of the present embodiment should be limited only by the following claims.

What is claimed is:

1. A light emitting device comprising:
   a substrate including a flexible base, a plurality of wiring portions and a groove portion, the flexible base extending in a first direction corresponding to a longitudinal direction of the substrate, the plurality of wiring portions arranged on the base, and the groove portion formed between the plurality of wiring portions being spaced apart from each other;
   a light emitting element disposed on the substrate and electrically connected to the plurality of wiring portions; and
   a sealing resin member sealing the light emitting element and a part of the substrate;
   wherein the sealing resin member is spaced apart from a first groove portion of the groove portion, the first groove portion extending in a second direction intersecting the first direction.

2. The light emitting device according to claim 1, wherein the sealing resin member and the first groove portion are arranged along the first direction at different locations.

3. The light emitting device according to claim 2, wherein the groove portion comprises a first groove portion, a second groove portion extending in the second direction, and a third groove portion connecting the first groove portion and the second groove portion, and the sealing resin member is disposed over the third groove portion.

4. The light emitting device according to claim 3, wherein the first groove portion and the second groove portion provide more bending flexibility in the second direction than bending flexibility at the third groove portion.

5. The light emitting device according to claim 1, wherein the light emitting element is spaced apart from the first groove portion of the groove portion and extends in a second direction intersecting with the first direction.

6. The light emitting device according to claim 3, wherein the sealing resin member and the second groove portion are arranged along the first direction at different locations.

7. The light emitting device according to claim 3, wherein the sealing resin member is located between the first groove portion and the second groove portion relative to the first direction.

8. The light emitting device according to claim 3, wherein the first groove portion and the second groove portion extend from the third groove portion in the same direction.

9. The light emitting device according to claim 3, wherein the first groove portion and the second groove portion extend from the third groove portion in opposite directions.

10. The light emitting device according to claim 1, wherein the groove portion defines a T-shape region.

11. The light emitting device according to claim 10, wherein at least one of the plurality of wiring portions includes a protrusion protruding in the T-shape region of the groove portion as viewed in a plan view.

12. The light emitting device according to claim 1, wherein the second direction is substantially perpendicular to the first direction.

13. A light emitting device comprising:
    a substrate including
       a flexible base extending in a first direction corresponding to a longitudinal direction of the substrate,
       a plurality of wiring portions disposed on the flexible base, and
       a first groove formed between a first wiring portion and a second wiring portion of the plurality of wiring portions such that the first groove separates the first wiring portion from the second wiring portion, the first groove extending in a second direction intersecting the first direction;
    a light emitting element disposed on the substrate and electrically connected to the plurality of wiring portions; and
    a sealing resin member sealing and covering the light emitting element, the sealing resin member being spaced apart from the first groove.

14. The light emitting device according to claim 13, wherein the sealing member is spaced apart from the first groove in first direction.

15. The light emitting device according to claim 13, wherein the substrate further has a second groove extending in the second direction, the second groove being spaced apart from a first groove, and a third groove connecting the first groove and the second groove.

16. The light emitting device according to claim 15, wherein the first groove and the third groove are connected, or the second groove and the third groove are connected.

17. The light emitting device according to claim 15, wherein the first groove, the second groove and the third groove separates the first wiring portion from the second wiring portion.

18. The light emitting device according to claim 15, wherein the sealing member being disposed over at least a portion of the third groove.

19. The light emitting device according to claim 13, wherein the substrate further has at least one a pair of terminal portions on the flexible base.

20. The light emitting device according to claim 15, wherein areas of the substrate adjacent to the first groove and the second groove have more bending flexibility in the second direction than bending flexibility of areas of the substrate adjacent to the third groove.

21. The light emitting device according to claim 15, wherein the light emitting element is spaced apart from the first groove and extends in a direction parallel to the second direction.

22. The light emitting device according to claim 15, wherein the sealing member and the light emitting element are located between the first groove and the second groove relative to the first direction.

23. The light emitting device according to claim 13, wherein the light emitting element is mounted on the substrate in a flip-chip manner.

24. The light emitting device according to claim 15, further comprising
    a pair of bonding members coupling the light emitting element to the plurality of wiring portions, the pair of bonding members being located between the substrate and the light emitting element.

25. The light emitting device according to claim 24, wherein the pair of bonding members are formed of a solder material.

26. The light emitting device according to claim 25, wherein the solder material is a Sn—Ag—Cu based solder.

* * * * *